(12) United States Patent
Gunnam

(10) Patent No.: US 8,555,129 B2
(45) Date of Patent: *Oct. 8, 2013

(54) ERROR-FLOOR MITIGATION OF LAYERED DECODERS USING NON-STANDARD LAYERED-DECODING SCHEDULES

(75) Inventor: Kiran Gunnam, San Jose, CA (US)

(73) Assignee: LSI Corporation, San Jose, CA (US)

( * ) Notice: Subject to any disclaimer, the term of this patent is extended or adjusted under 35 U.S.C. 154(b) by 929 days.

This patent is subject to a terminal disclaimer.

(21) Appl. No.: 12/510,722

(22) Filed: Jul. 28, 2009

(65) Prior Publication Data

US 2010/0042896 A1 Feb. 18, 2010

Related U.S. Application Data

(60) Provisional application No. 61/089,297, filed on Aug. 15, 2008.

(51) Int. Cl.
*H03M 13/00* (2006.01)
*G06F 11/00* (2006.01)

(52) U.S. Cl.
USPC ............ 714/752; 714/758; 714/800; 714/804

(58) Field of Classification Search
None
See application file for complete search history.

(56) References Cited

U.S. PATENT DOCUMENTS

| | | | |
|---|---|---|---|
| 3,755,779 A | 8/1973 | Price | |
| 4,295,218 A | 10/1981 | Tanner | |
| 5,048,060 A | 9/1991 | Arai et al. | |
| 5,721,745 A | 2/1998 | Hladik et al. | |
| 5,734,962 A | 3/1998 | Hladik et al. | |
| 6,023,783 A | 2/2000 | Divsalar et al. | |

(Continued)

FOREIGN PATENT DOCUMENTS

| | | | |
|---|---|---|---|
| JP | 2001251384 A | 9/2001 | |
| JP | 2005020505 A | 1/2005 | |

(Continued)

OTHER PUBLICATIONS

Radosavljevic, P.; de Baynast, A.; Cavallaro, J.R.; , "Optimized Message Passing Schedules for LDPC Decoding," Signals, Systems and Computers, 2005. Conference Record of the Thirty-Ninth Asilomar Conference on , vol., No., pp. 591-595, Oct. 28, 2005-Nov. 1, 2005, doi: 10.1109/ACSSC.2005.1599818.*

(Continued)

*Primary Examiner* — Albert Decady
*Assistant Examiner* — Justin R Knapp
(74) *Attorney, Agent, or Firm* — Mendelsohn, Drucker & Dunleavy, P.C.; Craig M. Brown; Steve Mendelsohn

(57) ABSTRACT

A layered decoder that uses a non-standard schedule, where a non-standard schedule is a schedule where the frequency of one or more layers in the schedule is greater than one. When the layered decoder converges on a near codeword using an initial schedule, the layered decoder identifies the layer $L_{maxb}$ of the near codeword, which layer contains the greatest number of unsatisfied check nodes, and selects a subsequent non-standard schedule from a schedule set. The non-standard schedules in the schedule set are sorted by key layer, where the key layer is a layer that appears in the non-standard schedule with the greatest frequency. The layer decoder selects a non-standard schedule from the schedule set where the key layer of selected non-standard schedule is equal to the identified $L_{maxb}$ value.

6 Claims, 10 Drawing Sheets

(56) References Cited

U.S. PATENT DOCUMENTS

| | | | |
|---|---|---|---|
| 6,236,686 B1 | 5/2001 | Kamishima | |
| 6,307,901 B1 | 10/2001 | Yu et al. | |
| 6,550,023 B1 | 4/2003 | Brauch et al. | |
| 6,678,843 B2 | 1/2004 | Giulietti et al. | |
| 6,745,157 B1 | 6/2004 | Weiss et al. | |
| 6,760,879 B2 | 7/2004 | Giese et al. | |
| 6,888,897 B1 | 5/2005 | Nazari et al. | |
| 6,910,000 B1 | 6/2005 | Yedidia et al. | |
| 7,143,333 B2 | 11/2006 | Blankenship et al. | |
| 7,181,676 B2 | 2/2007 | Hocevar | |
| 7,219,288 B2 | 5/2007 | Dielissen et al. | |
| 7,237,181 B2 | 6/2007 | Richardson | |
| 7,296,216 B2 | 11/2007 | Shen et al. | |
| 7,340,671 B2 | 3/2008 | Jones et al. | |
| 7,353,444 B2* | 4/2008 | Owsley et al. | 714/752 |
| 7,457,367 B2 | 11/2008 | Farhang-Boroujeny et al. | |
| 7,613,981 B2 | 11/2009 | Garg et al. | |
| 7,689,888 B2 | 3/2010 | Kan et al. | |
| 7,725,800 B2 | 5/2010 | Yang et al. | |
| 7,730,377 B2 | 6/2010 | Hocevar | |
| 7,739,558 B1 | 6/2010 | Farjadrad et al. | |
| 7,752,523 B1 | 7/2010 | Chaichanavong et al. | |
| 7,770,090 B1 | 8/2010 | Kons et al. | |
| 7,805,642 B1 | 9/2010 | Farjadrad | |
| 7,805,654 B2 | 9/2010 | Seki | |
| 7,895,500 B2 | 2/2011 | Sun et al. | |
| 7,904,793 B2 | 3/2011 | Mokhlesi et al. | |
| 7,941,737 B2 | 5/2011 | Gopalakrishnan et al. | |
| 7,949,927 B2 | 5/2011 | Park et al. | |
| 8,010,869 B2 | 8/2011 | Wejn et al. | |
| 8,020,070 B2 | 9/2011 | Langner et al. | |
| 8,037,394 B2 | 10/2011 | Djurdjevic et al. | |
| 8,046,658 B2 | 10/2011 | Heinrich et al. | |
| 8,051,356 B2 | 11/2011 | Park et al. | |
| 8,051,363 B1 | 11/2011 | Liu | |
| 8,103,931 B2 | 1/2012 | Wang et al. | |
| 8,127,209 B1 | 2/2012 | Zhang et al. | |
| 8,151,171 B2 | 4/2012 | Blanksby | |
| 8,156,409 B2 | 4/2012 | Patapoutian et al. | |
| 8,616,345 | 4/2012 | Graef | |
| 8,171,367 B2 | 5/2012 | Gao et al. | |
| 8,205,134 B2 | 6/2012 | Harrison et al. | |
| 8,205,144 B1 | 6/2012 | Yadav | |
| 8,214,719 B1 | 7/2012 | Sheng et al. | |
| 8,219,878 B1 | 7/2012 | Varnica et al. | |
| 8,255,763 B1 | 8/2012 | Yang et al. | |
| 8,301,984 B1 | 10/2012 | Zhang et al. | |
| 2002/0062468 A1 | 5/2002 | Nagase et al. | |
| 2002/0166095 A1 | 11/2002 | Lavi et al. | |
| 2005/0132260 A1 | 6/2005 | Kyung et al. | |
| 2005/0193320 A1 | 9/2005 | Varnica et al. | |
| 2005/0204255 A1 | 9/2005 | Yeh et al. | |
| 2005/0283707 A1 | 12/2005 | Sharon et al. | |
| 2006/0013306 A1 | 1/2006 | Kim et al. | |
| 2006/0036928 A1 | 2/2006 | Eroz et al. | |
| 2006/0107181 A1 | 5/2006 | Dave et al. | |
| 2006/0115802 A1 | 6/2006 | Reynolds | |
| 2006/0285852 A1 | 12/2006 | Xi et al. | |
| 2007/0011569 A1 | 1/2007 | Vila Casado et al. | |
| 2007/0011573 A1 | 1/2007 | Farjadrad et al. | |
| 2007/0011586 A1 | 1/2007 | Belogolovyi et al. | |
| 2007/0044006 A1 | 2/2007 | Yang et al. | |
| 2007/0071009 A1 | 3/2007 | Nagaraj et al. | |
| 2007/0089018 A1 | 4/2007 | Tang et al. | |
| 2007/0089019 A1* | 4/2007 | Tang et al. | 714/752 |
| 2007/0124652 A1 | 5/2007 | Litsyn et al. | |
| 2007/0147481 A1 | 6/2007 | Bottomley et al. | |
| 2007/0153943 A1 | 7/2007 | Nissila | |
| 2007/0162788 A1 | 7/2007 | Moelker | |
| 2007/0220408 A1 | 9/2007 | Huggett et al. | |
| 2007/0226587 A1 | 9/2007 | Park et al. | |
| 2007/0234178 A1 | 10/2007 | Richardson et al. | |
| 2007/0234184 A1 | 10/2007 | Richardson | |
| 2008/0049869 A1* | 2/2008 | Heinrich et al. | 375/298 |
| 2008/0082868 A1 | 4/2008 | Tran et al. | |
| 2008/0104485 A1 | 5/2008 | Lyakh et al. | |
| 2008/0109701 A1 | 5/2008 | Yu et al. | |
| 2008/0126910 A1 | 5/2008 | Venkatesan et al. | |
| 2008/0148129 A1 | 6/2008 | Moon | |
| 2008/0163032 A1 | 7/2008 | Lastra-Montano | |
| 2008/0235561 A1 | 9/2008 | Yang | |
| 2008/0276156 A1 | 11/2008 | Gunnam et al. | |
| 2008/0301517 A1 | 12/2008 | Zhong | |
| 2008/0301521 A1 | 12/2008 | Gunnam et al. | |
| 2009/0063931 A1* | 3/2009 | Rovini et al. | 714/758 |
| 2009/0083609 A1 | 3/2009 | Yue et al. | |
| 2009/0132897 A1 | 5/2009 | Xu et al. | |
| 2009/0150745 A1 | 6/2009 | Langner et al. | |
| 2009/0235146 A1 | 9/2009 | Tan et al. | |
| 2009/0259912 A1 | 10/2009 | Djordjevic et al. | |
| 2009/0273492 A1 | 11/2009 | Yang et al. | |
| 2009/0307566 A1 | 12/2009 | No et al. | |
| 2009/0319860 A1 | 12/2009 | Sharon et al. | |
| 2010/0037121 A1* | 2/2010 | Jin et al. | 714/763 |
| 2010/0042806 A1 | 2/2010 | Gunnam | |
| 2010/0042890 A1 | 2/2010 | Gunnam | |
| 2010/0050043 A1 | 2/2010 | Savin | |
| 2010/0058152 A1 | 3/2010 | Harada | |
| 2010/0088575 A1 | 4/2010 | Sharon et al. | |
| 2010/0192043 A1 | 7/2010 | Alrod et al. | |
| 2011/0041029 A1 | 2/2011 | Yedidia et al. | |

FOREIGN PATENT DOCUMENTS

| | | |
|---|---|---|
| JP | 2005500513 A | 1/2005 |
| JP | 2007036495 A | 11/2007 |
| JP | 2009100222 A | 5/2009 |
| WO | W003092170 A1 | 11/2003 |
| WO | W02004079563 A1 | 9/2004 |
| WO | WO2007114724 A1 * | 11/2007 |
| WO | W02008004215 A2 | 1/2008 |
| WO | WO 2010/019168 A1 | 2/2010 |

OTHER PUBLICATIONS

Presman, N.; Sharon, E.; Litsyn, S.; , "Efficient layers-based schedules for iterative decoding of LDPC codes," Information Theory, 2008. ISIT 2008. IEEE International Symposium on , vol., No., pp. 1148-1152, Jul. 6-11, 2008, doi: 10.1109/ISIT.2008.4595167.*

Vila Casado, A.I.; Griot, M.; Wesel, R.D.; , "Informed Dynamic Scheduling for Belief-Propagation Decoding of LDPC Codes," Communications, 2007. ICC '07. IEEE International Conference on , vol., No., pp. 932-937, Jun. 24-28, 2007, doi: 10.1109/ICC.2007.158.*

Vila Casado, Andres I., Weng, Wen-Yen and Wesel, Richard D. "Multiple Rate Low-Density Parity-Check Codes with Constant Blocklength," IEEE 2004, pp. 2010-2014.

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.

K. Gunnam et al., "Value-Reuse Properties of Min-Sum for GF(q)" (dated Oct. 2006) Dept. of ECE, Texas A&M University Technical Note, published about Aug. 2010.

K. Gunnam et al., "Value-Reuse Properties of Min-Sum for GF (q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.

Cavus, Enver et al., "An IS Simulation Technique for Very Low BER Performance Evaluation of LDPC Codes," IEEE International Conference on Communications, Jun. 1, 2006, pp. 1095-1100.

Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.

Richardson, Tom, "Error Floors of LDPC Codes," Allerton Conf. on Communication, Control and Computing, (Monticello, Illinois), Oct. 2003, pp. 1426-1435.

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Sripimanwat, K., "Turbo Code Applications: A Journey From a Paper to Realization", Oct. 26, 2005, Springer, p. 27.

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. I5.

Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol. 1.

Hao Zhong,Tong Zhang—"Block—LDPC: A Practical LDPC Coding System Design Approach", IEEE transactions on circuits and systems-I: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001,pp. 638-656,vol. 47, No. 2.

Tom Richardson—"Error Floors of LDPC Codes", IEEE Transactions on Information Theory, Feb. 2001, pp. 1426-1435,vol. 47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005,p. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.

David J.C. Mackay—"Information Theory, Inference, and Learning Algorithms", Cambridge University Press Sep. 2003, p. 640.

R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol. 50, No. 12.

Amin Shokrollahi—"LDPC Codes: An Introduction, in Coding, Cryptography and Combinatorics",Computer Science and Applied Logic, Birkhauser, Basel, 2004, pp. 85-110, vol. 23.

Yang Han and William E. Ryan—"LDPC Decoder Strategies for Achieving Low Error Floors", Proceedings of Information Theory and Applications Workshop, San Diego, CA, Jan. 2008, pp. 1-10.

Mohammad M. Mansour and Naresh R. Shanbhag—"Low Power VLSI decoder architectures for LDPC codes" International Symposium on Low Power Electronics and Design Proceedings of the 2002 , ICIMS Research Center, 2002, pp. 284-289.

Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963,p. 90.

T. Richardson and R. Urbanke—"Modern Coding Theory", Cambridge University Press, Preliminary version—Oct. 18, 2007, p. 590.

Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.

Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers, 2008, pp. 1148-1152.

D.J.C. Mackay and R.M. Neal—"Near Shannon limit performance of low density parity check codes", Electronics Letters 13th Mar. 1997, pp. 458-459, vol. 33 No. 6.

Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299,vol. 53, No. 8.

Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.

Andrew J. Blanksby and Chris J. Howland—"A 690-mW 1-Gb/s 1024-b, Rate-½ Low-Density Parity-Check Code Decoder", IEEE Journal of Solid-State Circuits, Mar. 2002.pp. 404-412,vol. 37, No. 3.

Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.

Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.

R.Michael Tanner—"A Recursive Approach to Low Complexity Codes",IEEE transaction on Information Theory, Sep. 1981, pp. 533-547,vol. IT-27, No. 5.

Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698,vol. 41, No. 3.

Badri N. Vellambi R, and Faramarz Fekri, "An Improved Decoding Algorithm for Low-Density Parity-Check Codes over the Binary Erasure Channel", IEEE GLOBECOM 2005 proceedings, pp. 1182-1186.

Yang Han, William E. Ryan—"Low-Floor Decoders for LDPC Codes", IEEE Transactions on Communications, vol. 57, No. 6, Jun. 2009, pp. 1663-1673.

PCT International Search Report dated Feb. 9, 2009 from International Application No. PCT/US 08/86537.

PCT International Search Report dated May 15, 2009 from International Application No. PCT/US 09/39279.

PCT International Search Report dated Feb. 12, 2009 from International Application No. PCT/US 08/86523.

PCT International Search Report dated May 28, 2009 from International Application No. PCT/US 09/41215.

PCT International Search Report dated May 15, 2009 from International Application No. PCT/US 09/39918.

Tuchler, M., et al., "Improved Receivers for Digital High Frequency Waveforms Using Turbo Equalization," Military Communications Conference; Milcom 2002 Proceedings; Anaheim, CA, Oct. 7-10, 2002; IEEE Military Communications Conference, New York, NY; IEEE; US, vol. 1, Oct. 7, 2002; pp. 99-104; XP002966498.

Alghonaim, E., et al., "Improving BER Performance of LDPC codes Based on Intermediate Decoding Results," Signal Processing and Communications; 2007; ICSPC, 2007; IEEE International Conference; IEEE; Piscataway, NJ; USA; Nov. 24, 2007; pp. 1547-1550; XP031380831.

Pusane, A.E.; Costello, D.J.; Mitchell, D.G.M;, "Trapping Set Analysis of Protograph-Based LDPC Convolutional Codes," Information Theory, 2009. ISIT 2009. IEEE International Symposium on, vol., No., pp. 561-565, Jun. 28, 2009-Jul. 3, 2009.

Laendner, S.; Milenkovic, O.;, "LDPC Codes Based on Latin Squares: Cycle Structure, Stopping Set, and Trapping Set Analysis," Communications, IEEE Transactions on, vol. 55, No. 2, pp. 303-312, Feb. 2007.

Dehkordi, M.K.; Banihashemi, A.H.;, "An Efficient Algorithm for Finding Dominant Trapping Sets of LDPC Codes," Turbo Codes and Iterative Information Processing (ISTC), 2010 6th International Symposium on, pp. 444-448, Sep. 6-10, 2010.

Zheng, H., et al., "MMSE-Based Design of Scaled and Offset BP-Based Decoding Algorithms on the Fast Rayleigh Fading Channel," IEEE International Symposium on Circuits and Systems, May 24, 2006, pp. 2061-2064.

Sakai, R., et al., "Reduced Complexity Decoding Based on Approximation of Update Function for Low-Density Parity-Check Codes," Transactions of the Institute of Electronics, Information and Communication Engineers, Feb. 1, 2007, vol. J90-A, No. 2, pp. 83-91.

Koetter, R., et al. "Turbo equalization," Signal Processing Magazine, IEEE, vol. 21, No. 1, pp. 67-80, Jan. 2004.

Cavus, E, et al., "Low BER performance estimation of LDPC codes via application of importance sampling to trapping sets," IEEE Transactions on Communications, vol. 57, No. 7, pp. 1886-1888, Jul. 2009.

Ryan, W. E., et al., "Channel Codes: Classical and Modern," Cambridge University Press, 2009, 710 pages.

\* cited by examiner

ERROR-FLOOR MITIGATION OF LAYERED DECODERS USING NON-STANDARD LAYERED-DECODING SCHEDULES

CROSS-REFERENCE TO RELATED APPLICATIONS

This application claims the benefit of the filing date of U.S. provisional application No. 61/089,297, filed on Aug. 15, 2008, the teachings of which are incorporated herein by reference in their entirety.

The subject matter of this application is related to (1) the subject matter of U.S. application Ser. No. 12/420,535 filed on Apr. 8, 2009, (2) the subject matter of U.S. application Ser. No. 12/333,840 filed on Dec. 12, 2008, (3) the subject matter of PCT application no. PCT/US08/86523 filed on Dec. 12, 2008, (4) the subject matter of PCT application no. PCT/US08/86537 filed on Dec. 12, 2008, (5) the subject matter of PCT application no. PCT/US09/39918 filed on Apr. 8, 2009, (6) the subject matter of U.S. application Ser. No. 12/401,116 filed on Mar. 10, 2009, (7) the subject matter of U.S. application Ser. No. 12/475,786 filed on Jun. 1, 2009, (8) the subject matter of U.S. application Ser. No. 12/260,608 filed on Oct. 29, 2009, (9) the subject matter of PCT application no. PCT/US09/41215 filed on Apr. 21, 2009(10) the subject matter of PCT application no. PCT/US09/39279 filed on Apr. 2, 2009, (11) the subject matter of U.S. application Ser. No. 12/323,626 filed on Nov. 26, 2008, (12) the subject matter of U.S. application Ser. No. 12/427,786 filed on Apr. 22, 2009, (13) the subject matter of US application no. U.S. Ser. No. 12/492,328 filed on Jun. 26, 2009, (14) the subject matter of U.S. application Ser. No. 12/492,346 filed on Jun. 26, 2009, (15) the subject matter of U.S. application Ser. No. 12/492,357 filed on Jun. 26, 2009, (16) the subject matter of U.S. application Ser. No. 12/492,374 filed on Jun. 26, 2009, (17) the subject matter of US patent no. 2008/0276156 published on Nov. 6, 2008, (18) the subject matter of US patent no. 2008/0301521 published on Dec. 4, 2008, (19) the subject matter of U.S. application Ser. No. xx/xxx,xxx filed on the same day as this application as and (20) the subject matter of U.S. application Ser. No. xxx/xxx,xxx filed on the same day as this application as the teachings of which are incorporated herein by reference in their entirety.

BACKGROUND OF THE INVENTION

1. Field of the Invention

The invention relates to digital signal processing, and, in particular, to data-encoding methods such as low-density parity check (LDPC) coding.

2. Description of the Related Art

Communication is the transmission of information from a transmitter to a receiver over a communications channel. In the real world, the communications channel is a noisy channel, providing to the receiver a distorted version of the information transmitted from the transmitter. A storage device (e.g., hard disk (HD) drive, flash drive) is one such noisy channel, accepting information from a transmitter, storing that information, and then providing a more or less distorted version of that information to a receiver.

The distortion introduced by a communications channel such as a storage device might be great enough to cause a channel error, i.e., where the receiver interprets the channel output signal as a 1 when the channel input signal was a 0, or vice versa. Channel errors reduce throughput and are thus undesirable. Hence, there is an ongoing need for tools that detect and/or correct channel errors. Low-density parity check (LDPC) coding is one method for the detection and correction of channel errors.

LDPC codes are among the known near-Shannon-limit codes that can achieve very low bit-error rates (BER) for low signal-to-noise ratio (SNR) applications. LDPC decoding is distinguished by its potential for parallelization, low implementation complexity, low decoding latency, as well as less-severe error floors at high SNRs. LDPC codes are considered for virtually all the next-generation communication standards.

SUMMARY OF THE INVENTION

A decoder-implemented method for decoding a decoder input codeword, where the method selects a decoding schedule for layered decoding, where the layered decoding corresponds to a code having two or more layers, and at least one layer in the code appears more than once in the selected decoding schedule. The method performs the layered decoding on the decoder input codeword using the selected decoding schedule.

A decoder for decoding a decoder input codeword, where the decoder selects a decoding schedule for layered decoding, where the layered decoding corresponds to a code having two or more layers, and at least one layer in the code appears more than once in the selected decoding schedule. The decoder performs the layered decoding on the decoder input codeword using the selected decoding schedule.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements.

DETAILED DESCRIPTION

Figure 1:
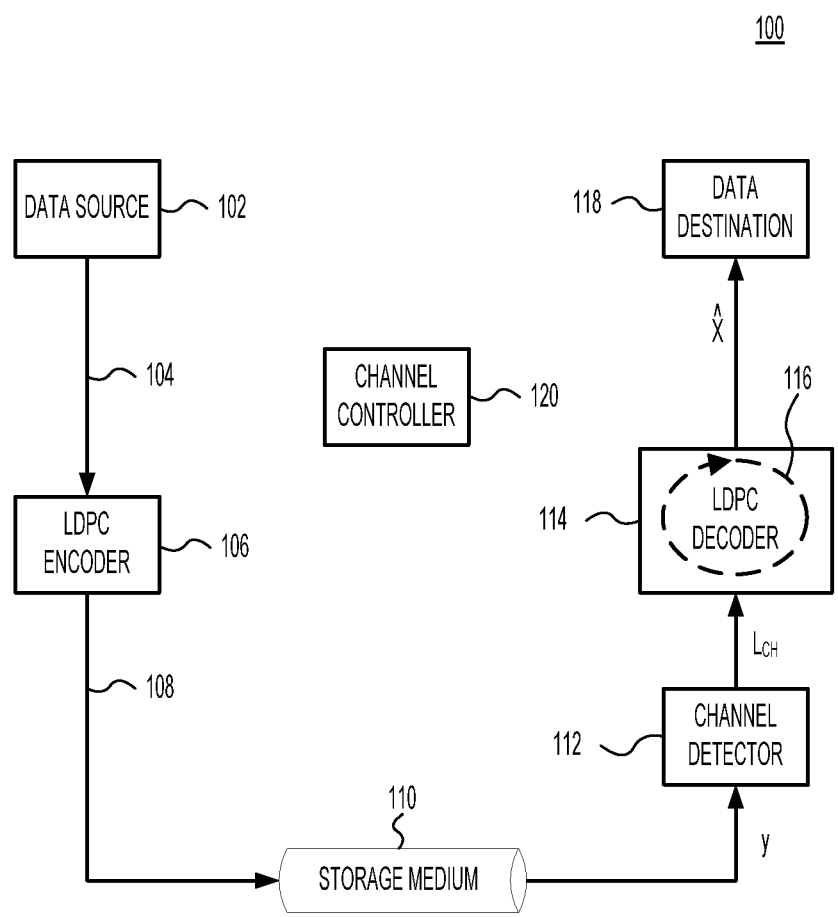
FIG. 1 is a block diagram of a communications system 100 that utilizes LDPC coding.

FIG. 1 is a block diagram of a communications system 100 that utilizes LDPC coding. Data source 102 generates a set of bits known as an original information word 104. LDPC encoder 106 encodes original information word 104 to generate original encoded codeword 108. LDPC encoding is discussed in greater detail below. Original encoded codeword 108 (also known as the channel input codeword) is written to storage medium 110 (e.g., a flash drive, hard-drive platter, etc) as a written encoded codeword.

At some later time, storage medium 110 provides the written encoded codeword as a set of values y (i.e., a channel output codeword) to channel detector 112. Channel detector 112 converts the received values y into a set of log-likelihood ratio (LLR) values $L_{ch}$. An LLR value comprises (i) a sign bit that represents the receiver's best guess as to the one-bit hard-decision value indicated by the corresponding value y and (ii) one or more magnitude bits that represent the receiver's confidence in the hard decision. For example, channel detector 112 might output each LLR value $L_{ch}$ as a five-bit value, where the most-significant bit is a sign bit that indicates the hard decision, and the value of the four magnitude bits indicates the confidence of the hard decision. Thus, in one possible LLR scheme, an LLR value of binary 00000 indicates a hard decision of 0 with least confidence, an LLR value of binary 01111 indicates a hard decision of 0 with maximum confidence, an LLR value of binary 10001 indicates a hard decision of 1 with least confidence, and an LLR value of binary 11111 would indicate a hard decision of 1 with maximum confidence, where binary 10000 is unused.

Channel detector 112 sends sets of $L_{ch}$ values to LDPC decoder 114 as decoder input codewords. LDPC decoder 114 performs one or more local decoding iterations 116 on each set of $L_{ch}$ values to generate a decoded codeword $\hat{x}$. LDPC decoder 114 terminates when either (i) LDPC decoder 114 arrives at a decoded correct codeword (DCCW), i.e., $\hat{x}$ is the same as channel input codeword 108, or (ii) LDPC decoder 114 performs a maximum allowable number of local iterations without arriving at the DCCW, i.e., LDPC decoder 114 has failed. When decoder 114 terminates, it outputs decoded codeword $\hat{x}$ to data destination 118. LDPC decoding is described in greater detail below.

Channel controller 120 controls the operations of one or more of LDPC encoder 106, channel detector 112, and LDPC decoder 114. The channel controller is typically an ARM (Advanced RISC (reduced instruction-set code) Machine) processor.

LDPC Encoding

To create codeword 108, LDPC encoder 106 appends to the bits of information word 104 a number of parity bits specified by the LDPC code. The number of bits in information word 104 is denoted K. The bits in an encoded codeword are known as variable bits, and the number of those variable bits is denoted N. Thus, the number of parity bits is given by N−K.

Each parity bit in an LDPC codeword is associated with one or more other bits in that codeword in a particular way as specified by the particular LDPC code, and the value assigned to a parity bit is set so as to satisfy the LDPC code. Typical LDPC codes specify that the parity bit and its associated bits satisfy a parity-check constraint, e.g., the sum of the bits is an even number, i.e., sum modulo 2=0.

The LDPC Code

A particular LDPC code is defined by a two-dimensional matrix of 1s and 0s known as the parity-check matrix, or H matrix, or simply H. H is known, a priori, by both the LDPC encoder and decoder. H comprises N columns and N−K rows, i.e., a column for every bit of the codeword, and a row for every parity bit. Each 1 in H represents an association between the codeword bit of the column and the parity bit of the row. For example, a 1 at the third row, seventh column of H means that the third parity-check bit is associated with the seventh bit of the codeword. The sum modulo 2 of the value of a check bit and all variable bits associated with that check bit should be 0. A defining characteristic of typical LDPC codes is that H is "sparse," i.e., the elements of H are mostly 0s with relatively few 1s.

Figure 2:
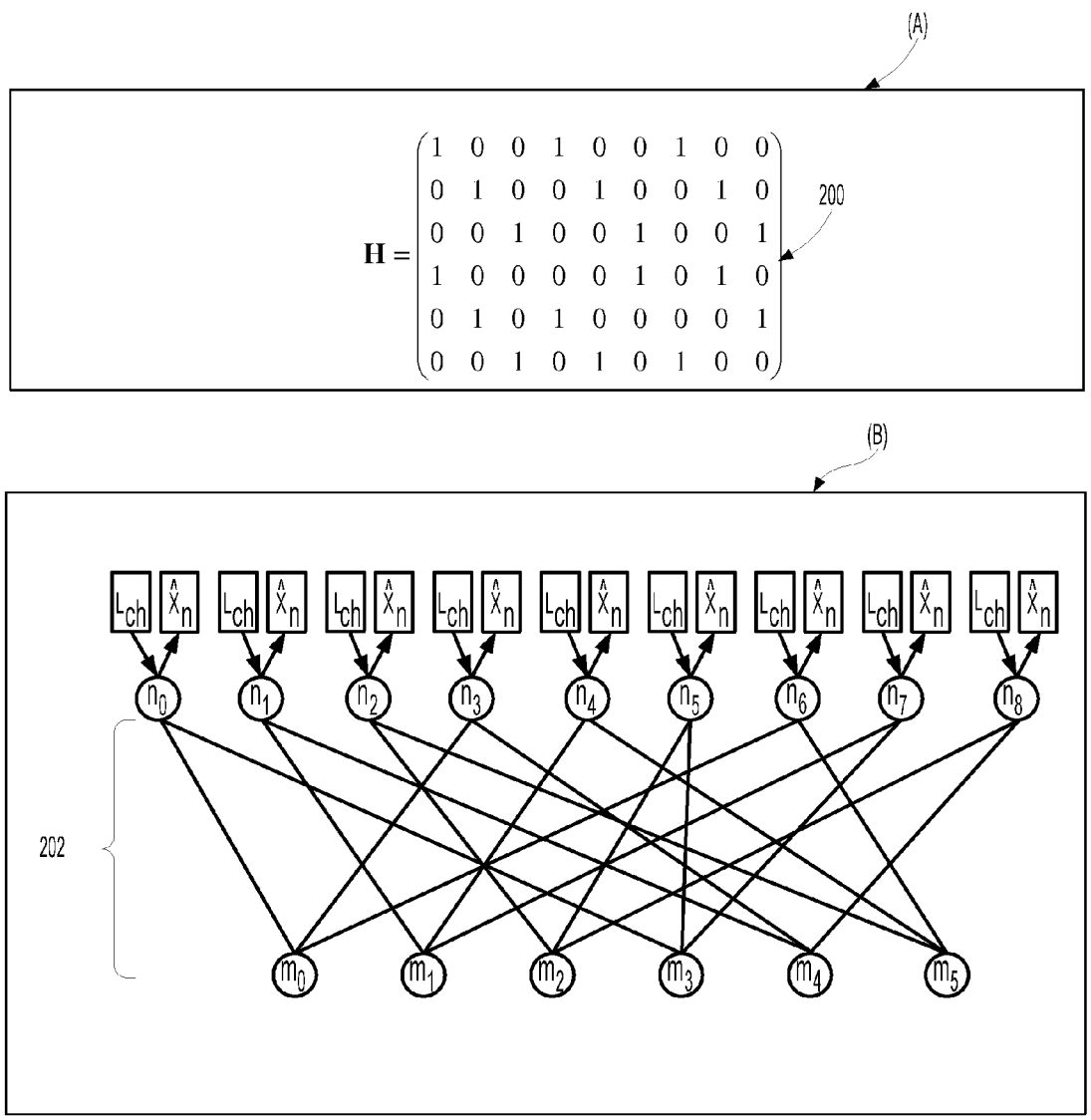
FIG. 2(A) depicts LDPC H matrix 200.
FIG. 2(B) is a Tanner graph of H matrix 200.

FIG. 2(A) depicts LDPC H matrix 200. H matrix 200 comprises N=9 columns and N−K=6 rows. Thus, H matrix 200 defines an LDPC code that accepts a three-bit information word, appends six parity bits, and outputs a nine-bit codeword. In one implementation in which the storage medium is a hard-disk drive or a flash drive, each information word is 4,096 bits in length, and each codeword is 4,552 bits in length. Other implementations may have information words and/or codewords having other bit lengths.

LDPC Decoding: Belief Propagation

Figure 3:
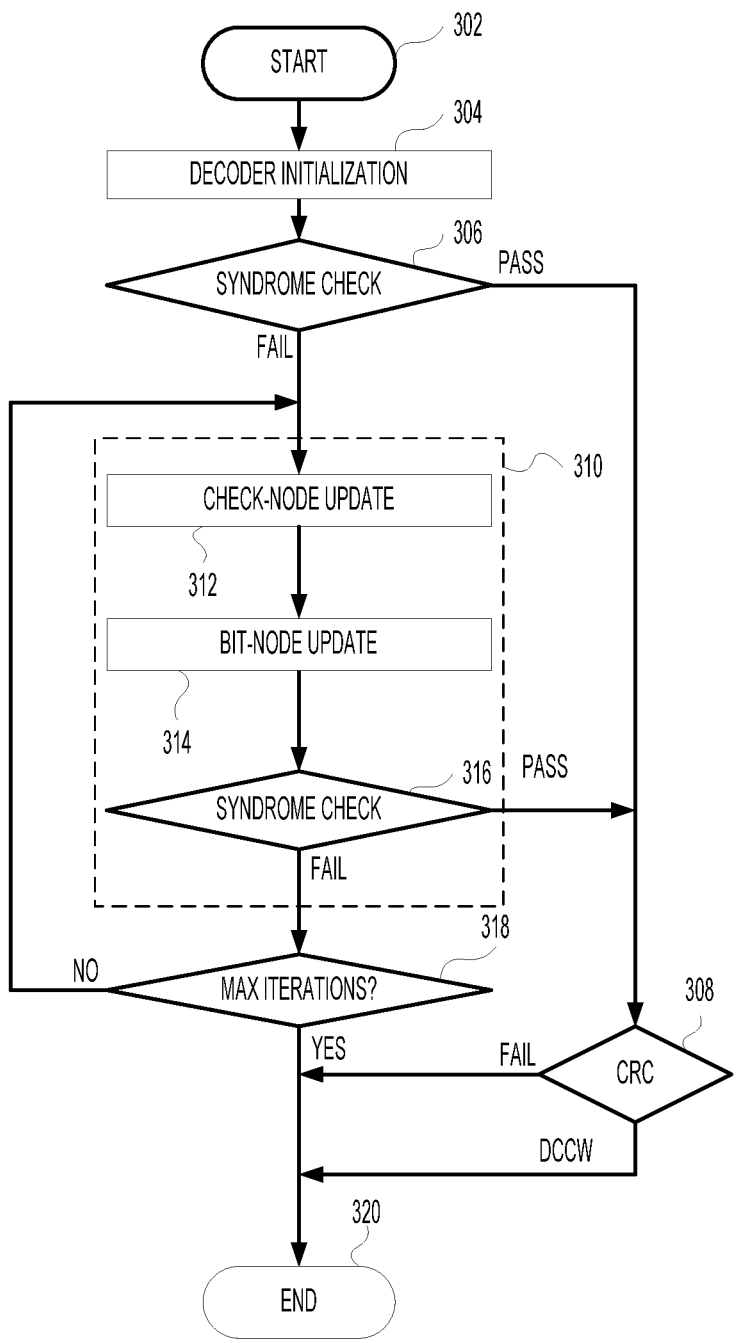
FIG. 3 is a flowchart of non-layered LDPC-decoding method 300 used by decoder 114 of FIG. 1.

FIG. 3 is a flowchart of non-layered LDPC-decoding method 300 used by decoder 114 of FIG. 1. The heart of decoding method 300 is an iterative, two-phase message-passing algorithm called belief propagation. Belief propagation can be explained with the use of a Tanner graph.

FIG. 2(B) is a Tanner graph for H matrix 200. In general, a Tanner graph comprises 1) a number of bit nodes (also known as variable nodes) n equal to the number of columns in H (and thus equal to the number N of variable bits, 2) a number of check nodes m equal to the number of rows in H (and thus equal to number of parity bits), 3) edges 202, each of which connects a single bit node $n_i$ to a single check node $m_j$, 4) for each bit node $n_i$, the original $L_{ch}$ value, and 5) for each bit node $n_i$, a calculated hard-decision output value $\hat{x}_n$. The Tanner graph of FIG. 2(B) comprises nine bit nodes $n_0$-$n_8$, six check nodes $m_0$-$m_5$, 18 edges 202 connecting bit nodes to check nodes, nine $L_{ch}$ values, and nine $\hat{x}_n$ values.

The edges in a Tanner graph represent the relationships between bit nodes n and check nodes m, where edges represent 1s in H. For example, in FIG. 2(B), an edge 202 connects first bit node $n_0$ to fourth check node $m_3$, because there is a 1 in the first column, fourth row of H matrix 200 in FIG. 2(A).

A Tanner graph is a bipartite graph, i.e., an edge can connect a bit node to only a check node, and cannot connect a bit node to another bit node, or a check node to another check node. The set of all bit nodes n connected by edges to a particular check node m is denoted N(m). The set of all check nodes m connected by edges to a particular bit node n is denoted M(n). The index of a particular (bit or check) node is its ordinal sequence in the graph.

Returning to FIG. 3, processing starts at step 302 and proceeds to step 304, decoder initialization. Decoder initialization 304 comprises setting all edges (e.g., edges 202 of FIG. 2(B)) connected to each bit node n to the corresponding $L_{ch}$ value associated with bit node n, and setting the $\hat{x}_n$ value of bit node n to the hard-decision value (i.e., MSB) of bit node n's $L_{ch}$. Thus, for example, in FIG. 2(B), if the $L_{ch}$ value associated with bit node $n_0$ is the decimal value +5, then, at step 304, the two edges 202 connecting bit node $n_0$ to check nodes $m_0$ and $m_3$ are set to +5, and bit node $n_0$'s $\hat{x}_n$ value is set to 1. An alternative way of expressing the first part of this step is that bit node $n_0$ sends a message of +5 to each check node m in set M($n_0$). A message sent from a bit node n to a check node m is called a bit-node message or Q message, and is denoted $Q_{nm}$.

Step 304 then sends to syndrome check 306 a candidate decoded codeword vector $\hat{x}$ comprising the N $\hat{x}_n$ values. Syndrome check 306 calculates syndrome vector z using the following Equation (1):

$$z = \hat{x} H^T \qquad (1)$$

where $H^T$ is the transpose of the H matrix. If syndrome vector z is a 0 vector, then vector $\hat{x}$ has satisfied all the parity-check constraints defined by H, i.e., $\hat{x}$ is a valid decoded codeword. In that case, processing proceeds to cyclic-redundancy check (CRC) 308 (discussed below).

If, instead, syndrome vector z is not a 0 vector, then vector $\hat{x}$ fails one or more of the parity-check constraints. Each non-zero element in syndrome vector z represents a failed parity-check constraint, which is also referred to as unsatisfied check node (USC). A USC is a check node associated with an odd number of erroneous bit nodes ("EBNs"). The number of non-zero elements in syndrome vector z is the number b of USCs in vector $\hat{x}$. Further, the indices of the non-zero elements of syndrome vector z are the indices of the USCs in vector $\hat{x}$.

If vector $\hat{x}$ fails syndrome check 306, then processing continues to the first of one or more decoding iterations 310 (called "local decoding iterations"). Local decoding iteration 310 comprises three steps: 1) a belief-propagation check-node update 312, 2) a belief-propagation bit-node update 314, and 3) a syndrome check 316, which is identical to syndrome check 306.

In belief-propagation check-node update 312, each check node m uses the $Q_{nm}$ messages received from all bit nodes n in set N(m) to calculate one or more check-node messages or R messages, denoted $R_{mn}$, according to the following Equations (2), (3), and (4):

$$R_{mn}^{(i)} = \delta_{mn}^{(i)} \max(\kappa_{mn}^{(i)} - \beta, 0) \quad (2)$$

$$\kappa_{mn}^{(i)} = |R_{mn}^{(i)}| = \min_{n' \in N(m)\backslash n} |Q_{n'm}^{(i-1)}| \quad (3)$$

$$\delta_{mn}^{(i)} = \left( \prod_{n' \in N(m)\backslash n} \mathrm{sgn}(Q_{n'm}^{(i-1)}) \right) \quad (4)$$

where i is the decoding iteration, N(m)\n is set N(m) excluding bit node n, the function sgn returns the sign of its operand, and β is a positive constant, the value of which depends on the code parameters. Each check node m sends the calculated $R_{mn}$ messages back along those same edges to all bit nodes n in set N(m).

Next, in belief-propagation bit-node update 314, each bit node n calculates one or more $Q_{nm}$ messages according to the following Equation (5):

$$Q_{nm}^{(i)} = L_n^{(0)} + \sum_{m' \in M(n)\backslash m} R_{m'n}^{(i)} \quad (5)$$

where $L_n^{(0)}$ is the original $L_{ch}$ value for bit node n, and M(n)\m is set M(n) excluding check node m. Each bit node n then sends the calculated $Q_{nm}$ messages to all check nodes m in set M(n).

Also during bit-node update 314, each bit node n updates its $\hat{x}_n$ value according to the following Equations (6) and (7):

$$E_n^{(i)} = \sum_{m' \in M(n)} R_{m'n}^{(i)} \quad (6)$$

$$P_n = L_n^{(0)} + E_n^{(i)} \quad (7)$$

If $P_n \geq 0$, then $\hat{x}_n = 0$, and if $P_n < 0$, then $\hat{x}_n = 1$. The values generated by Equation (6) are also referred to as extrinsic or E values, and denoted $E_{LDPC}$. The values generated by Equation (7) are referred to as P values. The specific belief-propagation algorithm represented by Equations (2)-(7) is known as the min-sum algorithm. Note that the $\hat{x}_n$ values are updated during each local decoding iteration 310 and finally outputted by decoding process 300. The original LLR values $L_{ch}$ remain unchanged during decoding process 300.

Bit-node update 314 sends to syndrome check 316 a vector $\hat{x}$ constructed out of the current $\hat{x}_n$ values of the decoder. If vector $\hat{x}$ passes syndrome check 316, then vector $\hat{x}$ is sent to CRC 308.

LDPC Decoding: Cyclic Redundancy Check and Mis-Satisfied Check Nodes

Passing syndrome check 306 or 316 means that vector $\hat{x}$ is a valid decoded codeword, but not necessarily the decoded correct codeword (DCCW). It is possible for an LDPC decoder to generate a valid decoded codeword that is not the DCCW. In that case, there are no USCs in vector $\hat{x}$, but there are mis-satisfied check nodes (MSCs). A mis-satisfied check node is a check node that is associated with an even number of erroneous bit nodes (EBNs).

Thus, to ensure that valid vector $\hat{x}$ is the DCCW, process 300 passes vector $\hat{x}$ to cyclic redundancy check (CRC) 308. A CRC check is a checksum operation that can detect alteration of data during transmission or storage. Specifically, an encoder (e.g., encoder 106 of FIG. 1) computes a first CRC checksum of a codeword that is to be sent, and sends both the first CRC checksum and the codeword to the decoder. The decoder, upon receipt of the codeword and the first CRC checksum, computes a second CRC checksum using the decoded codeword, and compares the second checksum to the first CRC checksum. If the two CRC checksums do not match, then there are errors in the decoded codeword.

If vector $\hat{x}$ passes CRC check 308, then vector $\hat{x}$ is the DCCW, and process 300 sets global variable DCCW to true, outputs vector $\hat{x}$, and terminates at step 320. Otherwise, vector $\hat{x}$ is not the DCCW, and process 300 sets global variable DCCW to false, outputs vector $\hat{x}$, and terminates at step 320. Global variable DCCW informs other decoding processes whether or not the DCCW has been generated.

Returning to syndrome check 316, if vector $\hat{x}$ fails the syndrome check, then there exist one or more USCs in vector $\hat{x}$. The typical method for resolving USCs is to perform another local decoding iteration 310. However, in a particular decoding session, there might exist one or more USCs that will never be satisfied in a reasonable amount of time (see the discussion of trapping sets, below). Thus, LDPC decoders are typically limited in how many local decoding iterations they perform. Typical values for the maximum number of iterations range from 50 to 200.

In FIG. 3, step 318 determines whether the specified maximum number of local decoding iterations has been reached. If not, then another local decoding iteration 310 is performed. If, instead, the maximum number of local decoding iterations has been reached, then decoder process 300 has failed. In that case, process 300 sets global variable DCCW to false, outputs vector $\hat{x}$, and terminates at step 320.

A complete execution of process 300 (with one or more local decoding iterations 310) is known as a local decoding session.

Layered Decoding and Decoding Schedules

A layer is a subset of check nodes. A typical layer is a subset of check nodes, i.e., rows of an H matrix, that have no bit nodes in common. Layers are numbered beginning with 0; thus, a four-layer H matrix comprises layers 0, 1, 2, and 3. For example, H matrix 200 in FIG. 2(A) may be decomposed into two sub-graphs corresponding to two layers, where (i) the first layer (layer 0) includes the first three check nodes (i.e., the first, second, and third rows in H matrix 200), which do not update common bit nodes, and (ii) the second layer (layer 1) includes the last three check nodes (i.e., the fourth, fifth, and sixth rows in H matrix 200), which also do not update common bit nodes.

LDPC decoding can be layered or non-layered. In non-layered decoding (e.g., decoding process 300 of FIG. 3), a local decoding iteration has three steps: (i) a single check-node update (e.g., step 312 of FIG. 3) of all check nodes in the codeword, (ii) a single bit-node update (e.g., step 314 of FIG. 3) of all bit nodes in the codeword, and (iii) a syndrome check (e.g., step 316 of FIG. 3) of the entire codeword.

In layered decoding, a local-decoding iteration comprises two or more decoding sub-iterations, wherein each decoding sub-iteration comprises (i) a check-node update of a different layer of the H matrix, (ii) a bit-node update of that layer, (iii) a syndrome check of that layer, and (iv) a convergence check of the decoder codeword.

The sequence in which layers are processed by a layered decoder is determined by a decoding schedule. For example, for an H matrix having three layers (i.e., layers 0, 1, and 2), a schedule of [1,0,2] implies that the layered decoder decodes using layer 1 first, layer 0 second, and layer 2 third. If, after layer 2, the layered decoder has not generated the DCCW, then the sequence is re-initiated.

As used herein, the term "decoding schedule" (or alternatively "schedule") refers a layer sequence that cannot be decomposed into two or more iterations of another layer sequence. For example, [0,1,2] is a schedule, but [0,1,2,0,1,2] is not a proper schedule because it is composed of two iterations of the layer sequence [0,1,2]. Note, further, that [0,1,2, 0,1,2,0] is a proper schedule. Although it contains two instances of the layer sequence [0,1,2], it cannot be decomposed into only those two instances due to the existence of the third instance of layer 0.

Figure 4:
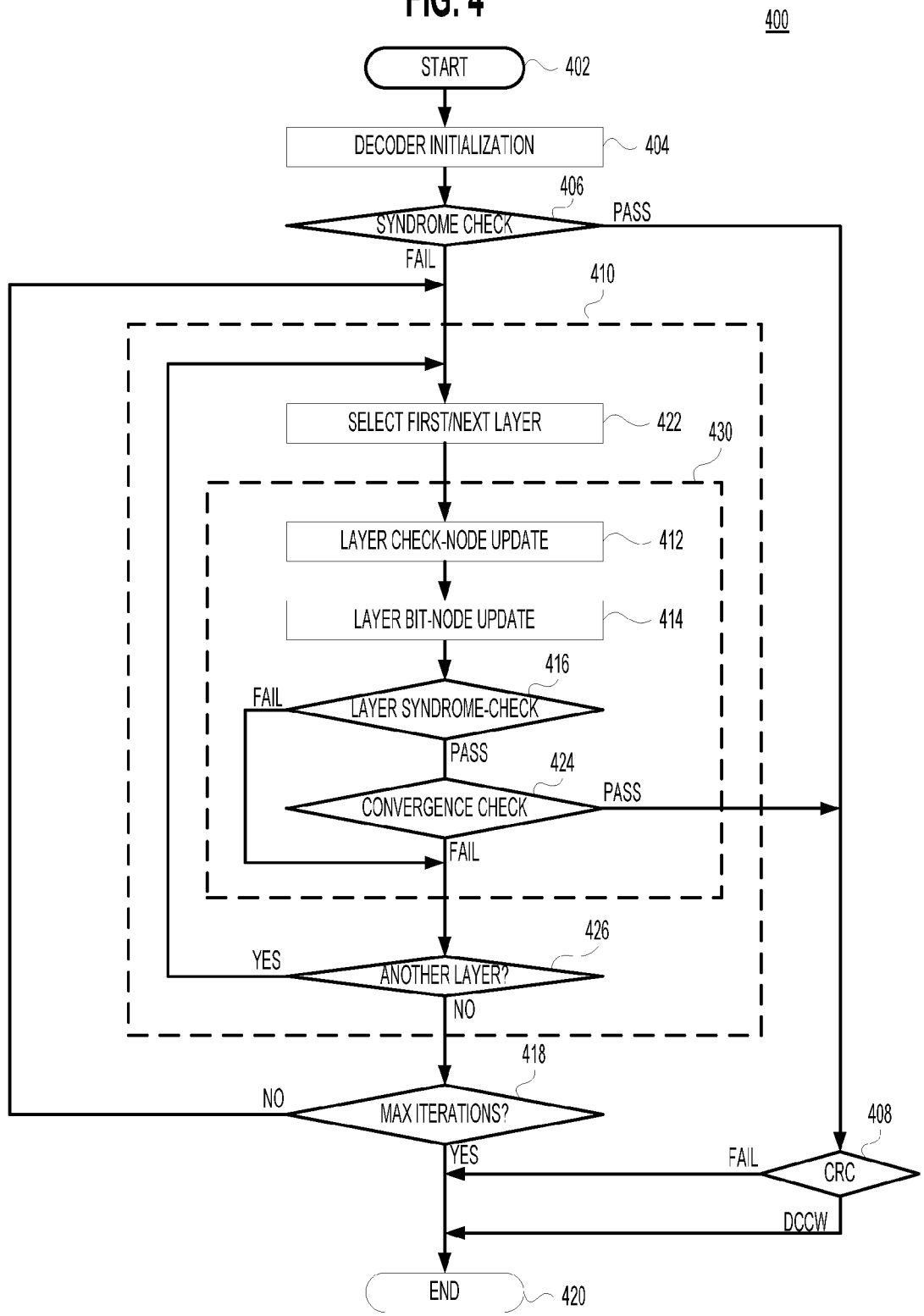
FIG. 4 is a flowchart of a layered LDPC-decoding process 400 executed by decoder 114 of FIG. 1.

FIG. 4 is a flowchart of a layered LDPC-decoding process 400 executed by decoder 114 of FIG. 1. The sequence in which layers are decoded by process 400 is specified by a schedule (not shown). Steps 402, 404, 406, 418, 408, and 420 of process 400 are analogous to steps 302, 304, 306, 318, 308, and 320 of FIG. 300.

Local decoding iteration 410 of process 400 is analogous to local decoding iteration 300 of FIG. 3 in that both local decoding iterations correspond to a single, complete pass through the corresponding H matrix. For local decoding iteration 300, a complete pass corresponds to a single update of each check node and bit node and a corresponding syndrome check. For local decoding iteration 410, a complete pass corresponds to a single implementation of the entire schedule associated with the layered decoder, where each layer in the schedule involves updating the check nodes and bit nodes associated with that layer and a corresponding layer syndrome check and convergence check.

Local decoding iteration 410 begins at step 422 with the selection of the first/next layer in the schedule. Sub-iteration 430 is then performed for the selected layer. In particular, at step 412, a check-node update is performed on the check nodes of the selected layer. The check-node update process of step 412 is analogous to the check-node update process of step 312 of FIG. 3. Next, at step 414, a bit-node update is performed on all bit nodes associated with the check nodes belonging to the selected layer. The bit-node update process of step 414 is analogous to the bit-node update process of step 314 of FIG. 3.

Next, at step 416, a syndrome check is performed on the selected layer. If the selected layer fails layer syndrome check 416, then processing continues to step 426; otherwise, processing continues to convergence check 424. To pass convergence check 424, (i) no layer in the codeword can have any USCs and (ii) all layers in the codeword must be stable, i.e., for each layer, no bit node changed value during the most-recent performance of step 414 on that layer. If convergence check 424 passes, then process 400 continues to CRC check 408; otherwise, control passes to step 426, where it is determined if there is another layer in the schedule. If so, then processing returns to step 422 to select the next layer in the schedule and perform another sub-iteration 430 with that next layer. Otherwise, processing passes to step 418.

The bit-error rate (BER) of an LDPC decoder represents the probability that a decoded bit has the wrong value. Thus, for example, a decoder with a BER of $10^{-9}$ will, on average, generate one erroneous bit for every billion decoded bits. The failure of an LDPC decoding session to converge on the DCCW contributes to the BER of the decoder.

The BER of an LDPC decoder is strongly influenced by the signal-to-noise ratio (SNR) of the decoder's input signal. A graph of BER as a function of SNR typically comprises two distinct regions: an initial "waterfall" region where the BER improves (decreases) rapidly given a unit increase in SNR, and a subsequent "error-floor" region where increases in SNR yield only modest improvements in BER. Thus, achieving significant BER improvements in the error-floor region requires methods other than SNR increase.

In a typical LDPC-decoding session, the decoder converges on the DCCW within the first several local decoding iterations. When, instead, an LDPC decoder fails to converge on the DCCW within the specified maximum number of iterations, the LDPC decoder is known as a failed decoder, and the decoded codeword generated by a failed decoder is a failed codeword.

Failed codewords typically are classified by the number b of USC nodes they contain. An invalid decoded codeword (ICW) is a failed codeword with a large b value (e.g., greater than 16 for an approximately 5,000-bit codeword). ICWs typically result from a decoder input codeword that contains so many bit errors, i.e., so few correct values, that the decoder is unable to correct all the bit errors. A typical post-processing method for handling an ICW is to request a re-send of the input codeword.

A near codeword (NCW) is a failed codeword that possesses a small b value (e.g., 16 or fewer for an approximately 5,000-bit codeword). Sometimes, the USCs, EBNs, and MSCs in an NCW form a stable configuration, known as a trapping set, for which further local decoding iterations will not produce the DCCW. The majority of trapping sets comprise fewer than five USCs and fewer than ten EBNs. A trapping set might have no USCs, i.e., the trapping set might be composed solely of MSCs and their associated EBNs.

Trapping sets have a significant impact on the error-floor characteristics of an LDPC decoder, i.e., when a decoder fails in the error-floor region, the failure is typically due to a trapping set. Changing one or more parameters of a local decoding session (e.g., EBN values, check-node update methods, etc.) and performing further decoding might result in the decoder converging on the DCCW. When successful, this process is referred to as breaking the trapping set.

A typical layered decoder is not limited to using the same schedule for every local decoding iteration, but can be reconfigured with a different schedule at any time, e.g., between local decoding iterations. Changing the schedule of a layered decoder and re-performing decoding can break a trapping set. For example, if a four-layer decoder with a schedule of [0,1, 2,3] fails with an NCW that contains a trapping set, then reconfiguring the decoder with another schedule, e.g., [0,2,1, 3] and re-performing decoding might break the trapping set.

According to certain embodiments of the present invention, there is no theoretical limitation on the length of a schedule, the sequence of layers in a schedule, or on the number of times a particular layer appears in a schedule, also known as the frequency of the layer, wherein the frequency of a layer is one or greater. Hence, there are an infinite number of possible schedules for any given layered decoder. For example, a five-layer decoder can have the schedule [4,1,0,2,3], or the schedule [0,4,0,1,3,2,4,2,4,4,2]. In the first schedule, all layers have a frequency of one. In the second schedule, layers 1 and 3 have a frequency of one, layer 0 has a frequency of two, layer 2 has a frequency of three, and layer 4 has a frequency of four.

Although there are an infinite number of possible schedules, prior-art layered decoders use only schedules where each layer is decoded once (i.e., where each layer has a frequency of one), also known as standard schedules. Thus, for a five-layer decoder, [0,1,2,3,4], [4,3,2,1,0], and [4,0,1,3,2] are three possible standard schedules. A typical layered decoder uses the same standard schedule, i.e., a default schedule, for the initial decoding of every codeword.

There exist n! different standard schedules for an n-layer code. Accordingly, for a particular n-layer decoder, the universe of possible schedules can be divided into two sets: a first set containing n! standard schedules, and a second set containing an infinite number of non-standard schedules. A non-standard schedule is a schedule where one or more layers occur with a frequency greater than one.

It is possible to implement a layered decoder with a schedule memory that stores a schedule set of one or more schedules for the layered decoder. Such a schedule set stored in a schedule memory may be referred to as a decoding-schedule database. If the layered decoder fails to converge on the DCCW using a particular schedule, then the layered decoder can select a different schedule from the schedule set and re-perform decoding using that different schedule. This process is repeated until either (i) the layered decoder converges on the DCCW or (ii) all schedules in the schedule memory have been used.

Figure 5:
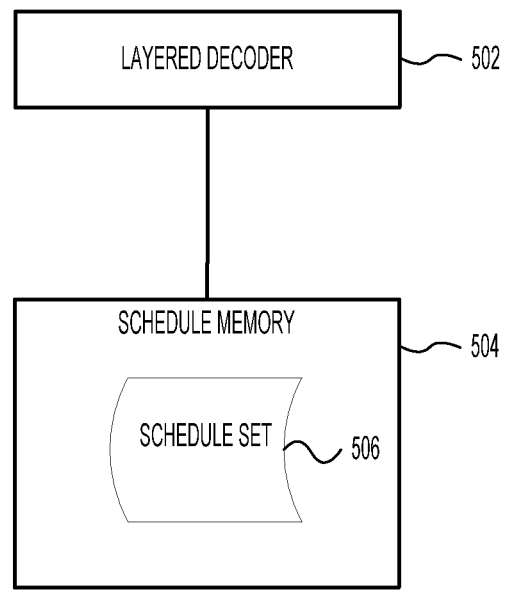
FIG. 5 is a block diagram of layered-decoding system 500.

FIG. 5 is a block diagram of layered-decoding system 500. System 500 comprises layered decoder 502 and schedule memory 504. The layered decoder is connected to the schedule memory. The schedule memory stores a schedule set 506. In a typical implementation, schedule set 506 is a data structure, e.g., a table, comprising a single column (field). Schedule set 506 comprises any number of rows (records) wherein each row identifies a single schedule.

Figure 6:
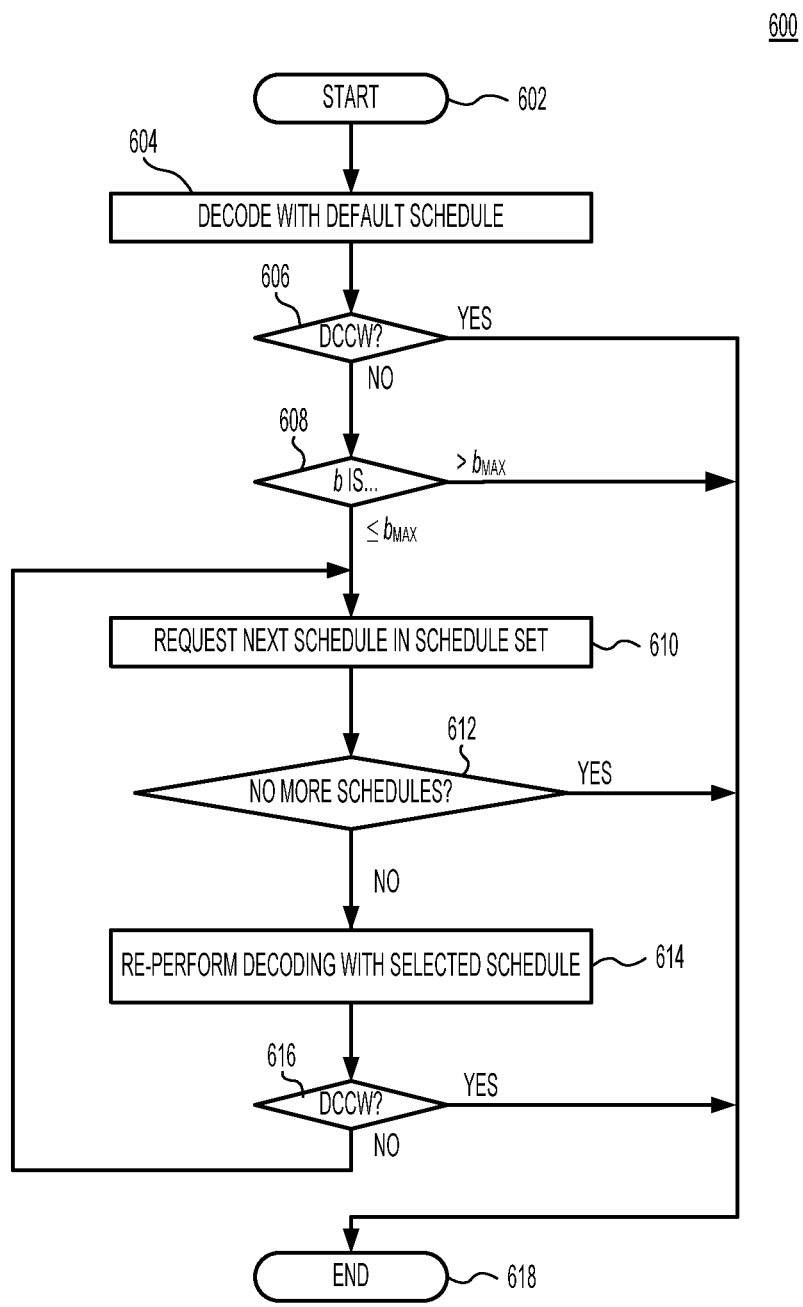
FIG. 6 is a flowchart of a layered-decoding process 600 that may be executed by layered decoder 502 of system 500.

FIG. 6 is a flowchart of a layered-decoding process 600 that may be executed by layered decoder 502 of system 500. Processing begins at step 602 and proceeds to step 604 where layered decoder 502 performs decoding using a default schedule. If, at step 606, layered decoder 502 has converged on the DCCW, then processing terminates at step 618. Otherwise, layered decoder 502 has converged on a failed codeword, and processing proceeds to step 608.

If, at step 608, the number b of USCs in the failed codeword exceeds a pre-defined threshold $b_{max}$, e.g., 16, then the codeword is an invalid codeword, and process 600 terminates at step 618. If, instead, at step 608, the value of b is less than or equal to $b_{max}$, then the codeword is an NCW, and processing proceeds to step 610. Note that, if b=0, then the NCW is a near-codeword mis-correction (NCW-MC), i.e., the NCW comprises no USCs, but instead comprises one or more mis-satisfied check (MSC) nodes.

At step 610, process 600 requests the next schedule from schedule set 506, where the schedule requested is different from all previously selected schedules, including the default schedule. Next, at step 612, if there are no more schedules to be selected, i.e., the schedule request of step 610 failed, then processing terminates at step 618. If, instead, at step 612, another matching schedule is available, then processing proceeds to step 614 where the selected schedule is loaded into layered decoder 502 and decoding, i.e., process 400 of FIG. 4, is re-performed.

If, at step 616, decoder 502 has converged on the DCCW, then process 600 terminates at step 618. Otherwise, processing loops back to step 610 where a next schedule is selected from the schedule set.

A typical decoder (e.g., layered decoder 502 of FIG. 5) has limited resources, e.g., memory, clock cycles, etc., and can store only a small number (e.g., 100) of standard schedules in a schedule memory. Since there are an infinite number of non-standard schedules, storing all non-standard schedules in schedule memory is impossible.

An n-layer decoder has n! standard schedules. A typical layered decoder has anywhere from 3 to 128 layers. A 4-layer decoder has only 24 standard schedules, but a 10-layer decoder has over 3.6 million standard schedules, and a 15-layer decoder has over 1.3 trillion standard schedules. For all but a few layered decoders, storing all standard schedules in a schedule memory is impractical.

Thus, key steps in implementing system 500 of FIG. 5 are (i) determining the number s of schedules that schedule memory 504 can store and (ii) selecting a schedule set 506 of s schedules to store in the schedule memory. Ideally, the selected schedule set is the set of s schedules which, collectively, successfully decode the largest number of NCWs, i.e., break the largest number of trapping sets.

Successfully decoding NCWs typically involves breaking trapping sets, and trapping sets vary from implementation to implementation, even when the same LDPC code is implemented. For example, even if the same LDPC code is used on two HD drives, the trapping sets associated with the HD drives may differ. Specifically, trapping sets are influenced by an HD drive's jitter profile, inter-symbol interference characteristics, and pulse-shaping scheme. These factors can vary not only between HD drives of different manufacturers, but also between different HD drive models from the same manufacturer. Thus, a particular standard schedule that breaks 12 trapping sets for a particular implementation might break 0 trapping sets or 200 trapping sets in another implementation.

Because trapping sets are implementation specific, offline schedule testing is used to select a schedule set for a particular implementation from a set of schedules, i.e., a schedule population. In offline schedule testing, a particular implementation (e.g., system 100 of FIG. 1) is simulated in software and/or in a field-programmable gate array (FPGA). The simulation is then run continuously for a period of time during which schedules from the schedule population are used to decode near codewords generated by the simulation. The words "simulated" and "production" will be used to distinguish between non-realtime apparatuses simulated in software or FPGA, e.g., a simulated layered decoder, and finalized, real-time physical apparatuses, e.g., a production layered decoder.

Figure 7:
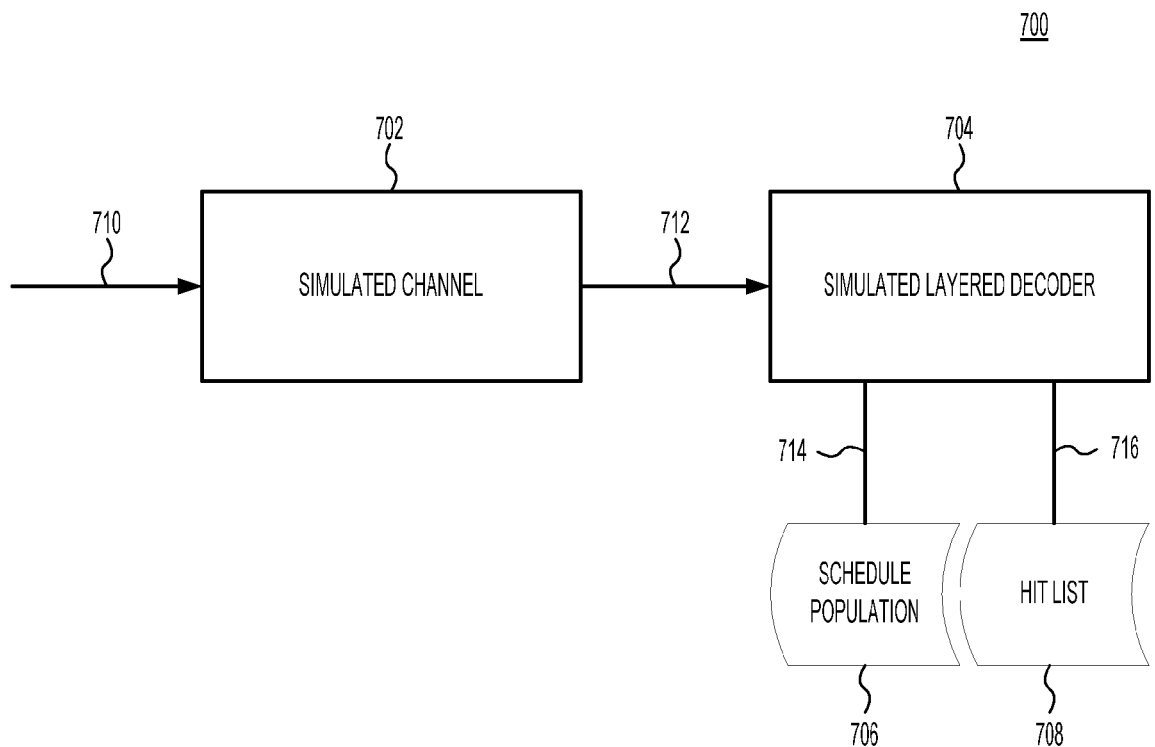
FIG. 7 is a block diagram of a portion of offline schedule-testing system 700.

FIG. 7 is a block diagram of a portion of offline schedule-testing system 700. System 700 comprises simulated channel 702, simulated layered decoder 704, schedule population 706, and hit list 708. Simulated channel 702 simulates the properties of a communications channel, e.g., storage medium 110 and channel detector 112 of FIG. 1. Simulated layered decoder 704 simulates the behavior of a layered decoder, e.g., layered decoder 502 of FIG. 5. Schedule population 706 is a data structure that contains a set of schedules to be tested. Each schedule in the schedule population has a unique identifier (schedule ID). Hit list 708 is a data structure that records data pertaining to successful decodings.

Simulated channel 702 receives channel input codewords 710 and outputs decoder-input codewords 712 to simulated layered decoder 704. Simulated layered decoder 704 reads schedules 714 from schedule population 706 and writes data 716 pertaining to successful decodings to hit list 708.

Figure 8:
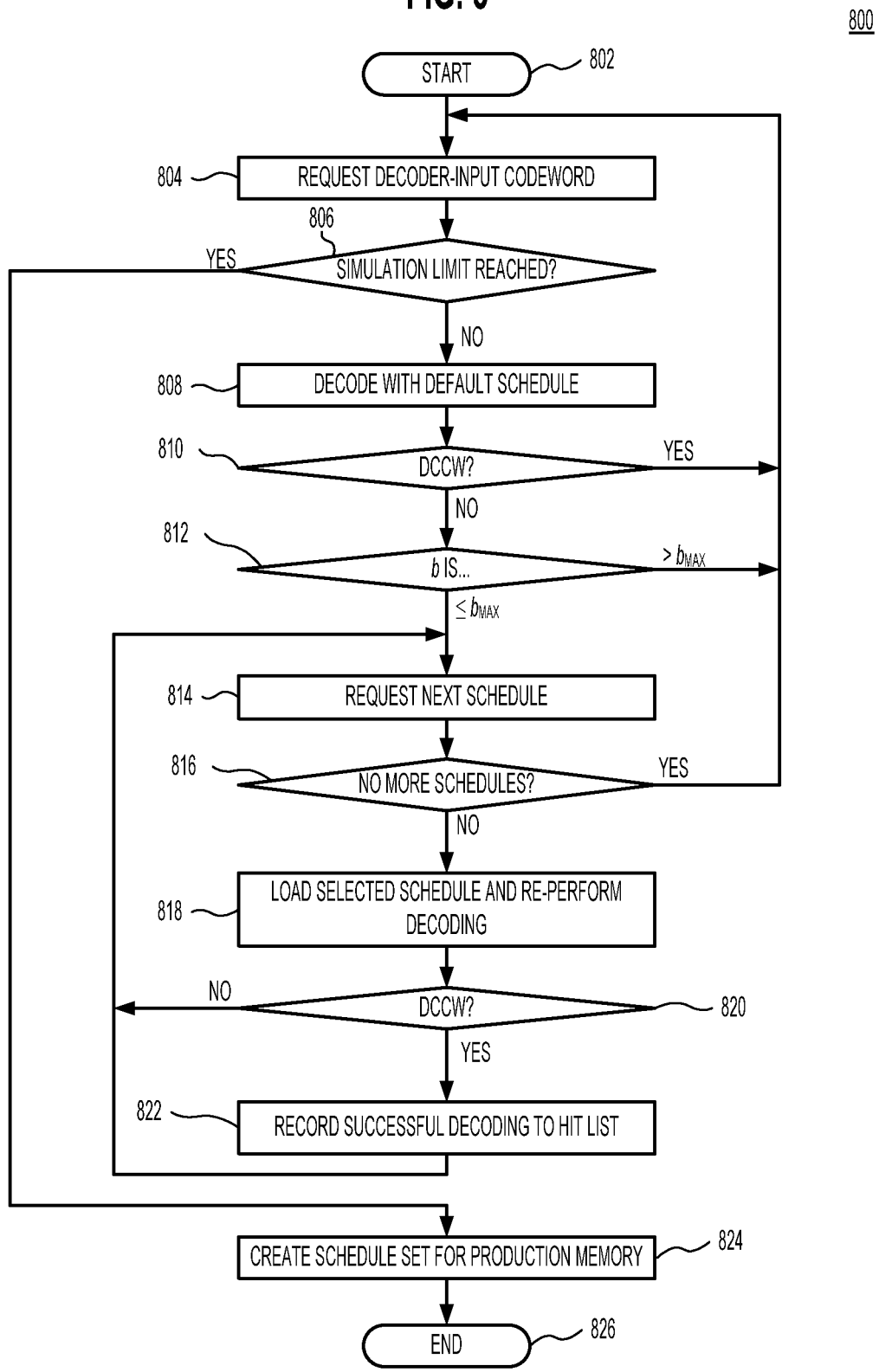
FIG. 8 is a flowchart of offline schedule-testing process 800 executed by simulated layered decoder 704 in system 700 of FIG. 7.

FIG. 8 is a flowchart of offline schedule-testing process 800 executed by simulated layered decoder 704 in system 700 of FIG. 7. Processing begins at step 802 and proceeds to step 804 where simulated layered decoder 704 requests a next decoder-input codeword 712 from simulated channel 702. If, at step 806, it is determined that the simulation limit has been reached, e.g., a pre-defined limit on the number of codewords or overall processing time has been exceeded, then processing continues to step 824 (described below). Otherwise, processing proceeds to step 808 where the decoder-input codeword is decoded using a default schedule.

Next, at step 810, if simulated layered decoder 704 converged on the DCCW using the default schedule, then processing loops back to step 804 where a next decoder-input codeword is requested. If, instead, at step 810, the simulated decoder failed to converge on the DCCW and, thus, outputted a failed codeword, then processing continues to step 812, where it is determined whether the number b of USCs in the failed codeword exceeds a pre-defined threshold $b_{max}$. If $b > b_{max}$, then the failed codeword is an invalid codeword, and processing loops back to step 804 where a next decoder-input codeword is requested. If, instead, $b \leq b_{max}$, then the failed codeword is a near codeword (NCW), and processing continues to step 814 where the next schedule 714 is requested from schedule population 706.

Next, at step 816, if there are no more schedules in schedule population 706, i.e., the request of step 814 failed, then processing loops back to step 804 where a next decoder-input codeword is requested. Otherwise, processing continues to step 818 where the selected schedule is loaded into simulated layered decoder 704 and decoding, i.e., process 400 of FIG. 4, is re-performed. If the simulated layered decoder does not converge on the DCCW, then, at step 820, processing loops back to step 814 where a next schedule is requested from the schedule population.

If, instead, at step 818, the simulated layered decoder does converge on the DCCW, then, at step 820, processing continues to step 822 where the successful decoding is recorded in hit list 708. Specifically, if no hit counter exists in the hit list for the current schedule ID, then a counter is created for the current schedule ID in the hit list and the counter is initialized to 1. If, instead, a counter is found for the current schedule ID in the hit list, then the counter is incremented.

Processing then loops back to step 814 where a next schedule is requested from schedule population 706.

At step 824, hit list 708 is analyzed and a schedule set is created for a production schedule memory. If the production schedule memory of the actual decoder can store a maximum number s of schedules, then the analysis at step 824 is to identify the set of s schedules that successfully decode the greatest number of NCWs. Once the analysis is complete, process 800 terminates at step 825.

In offline schedule-testing process 800 of FIG. 8, every generated NCW typically is tested against every schedule in the schedule population. It is not uncommon to test 10,000 NCWs during offline schedule testing. Simulating on a dedicated computer the decoding of a single NCW with a single schedule takes approximately 1 second. Thus, to test a single schedule against 10,000 codewords takes 10,000 seconds, or 2.78 hours. A decoder with 10 layers (a typical value) has over 3.6 million standard schedules. Testing 3.6 million standard schedules against 10,000 codewords using a single computer would take more than 1,140 years. Even running 150 computers simultaneously requires over 7 years of test time. Thus, assuming 10,000 NCWs and n! standard schedules, offline schedule-testing method 800 of FIG. 8 is impractical for most layered decoders.

In a failed layered decoder, the layer that contains the largest number b of unsatisfied check nodes (USCs) is denoted $L_{maxb}$. For example, if a layered decoder fails, and layer 2 is the layer in the failed decoder that contains the largest number b of USCs, then $L_{maxb}=2$. If there are two or more layers with an equal, greatest b value, then one layer may be selected at random to be $L_{maxb}$.

A triad is a sequence of three layers where no layer is repeated. Thus, [0,1,2] and [8,30,63] are valid triads for a 100-layer code, whereas [0,1] and [63,30,63] are not. Triads are direction specific, e.g., triad [8,30,63] and triad [63,30,8] are two distinct triads. In an n-layer code where n is greater than 2, there are n(n-1)(n-2) triads.

For a given pairing of a standard schedule and an NCW, the layer in the standard schedule that matches the $L_{maxb}$ value of the NCW is called the key layer, and the triad in the standard schedule that contains the key layer as the middle layer is called the key triad. Thus, if the pairing is a standard schedule [0,1,2,3,4,5] and an NCW with $L_{maxb}=2$, then layer 2 is the key layer in the standard schedule, and [1,2,3] is the key triad in the standard schedule.

The ability of a particular standard schedule to successfully decode a particular NCW is largely a function of the key triad of the standard schedule, and has little to do with the number n of layers in the code, the location of the key triad in the schedule, or the location or sequence of the non-key-triad layers of the standard schedule. For example, if a five-layer decoder fails with an NCW where $L_{maxb}=2$, there is no need to test both standard schedule [4,3,2,1,0] and standard schedule [4,0,3,2,1], because both schedules contain the same key triad [3,2,1], and the location of non-key-triad layers 0 and 4 is more or less irrelevant. Both schedules will be equally successful or unsuccessful in decoding the NCW. The same is true for the other standard schedules containing key triad [3,2,1]. Note that schedules like [2,1,0,4,3] and [1,4,0,3,2] are also schedules that contain key triad [3,2,1] because the sequence of layer 3 followed by layer 2 followed by layer 1 occurs in two consecutive iterations of each of those schedules. In general, it is not necessary to test all n! possible standard schedules against a population of NCWs; testing schedules having each of the n(n-1)(n-2) different triads is sufficient.

Triad-Based Population-Selection Methods

Certain embodiments of the present invention are triad-based population-selection methods for selecting a population of standard schedules of an n-layer code for offline schedule testing, wherein (i) each of the n(n-1)(n-2) triads of the code are present in at least one schedule in the population and (ii) each schedule is associated with at least one key-layer value.

In certain triad-based population-selection methods, a separate schedule is selected and added to the schedule population for each triad. Thus, for example, assume a six-layer decoder with n(n-1)(n-2) or 120 possible triads. Assume the first triad selected is [0,1,2]. There are (n-2)! or 24 schedules that contain the triad [0,1,2], i.e., [0,1,2,3,4,5], [5,0,1,2,3,4], [4,5,0,1,2,3], [3,4,5,0,1,2], [0,1,2,3,5,4], [4,3,0,1,2,5], and so forth. One of the 24 schedules is selected at random to be the schedule and added to the schedule population, along with a designation of the key layer of the schedule. A next triad is selected, e.g., [0,1,3], and a schedule containing the triad [0,1,3] is randomly selected and added to the schedule population, along with a designation of the key layer of the schedule. The process is repeated until all 120 triads have been exhausted.

In certain other triad-based population-selection methods, a single schedule in the schedule population might be associated with more than one triad. For example, the five-layer schedule [0,1,2,3,4] contains five triads: [0,1,2], [1,2,3], [2,3,4], [3,4,0], [4,0,1]. To generalize, an n-layer standard schedule comprises n unique triads.

Thus, schedule [0,1,2,3,4] is added to the schedule population along with five designations linking the schedule to triads [0,1,2], [1,2,3], [2,3,4], [3,4,0], and [4,0,1]. The benefit of this method is that the memory space occupied by the resulting population is considerably less. This method might not alter the total number of decodings to be performed by offline schedule testing.

Note that a schedule population generated according to triad-based population-selection methods will include, for every schedule in the population, a designation of the key layer of the schedule, whereas a schedule population generated according to the prior art does not.

Using triad-based population-selection methods to select a schedule population can reduce the number of schedules in the schedule population from the n! schedules of the prior art to n(n-1)(n-2) schedules or even fewer. The greater the number of layers in the schedule, the greater the reduction. For example, for eight layers, the population drops from 40,320 schedules to 336 schedules or fewer. For ten layers, the population drops from 3,628,800 schedules to 720 schedules or fewer.

Layered-Decoding Systems that Select Standard Schedules based on $L_{maxb}$

Certain embodiments of the present invention are $L_{maxb}$-based layered-decoding systems that, upon converging on a near codeword (NCW) using a first schedule, are adapted to (i) select a second standard schedule, different from the first, from a schedule set, based on the $L_{maxb}$ value of the NCW, (ii) re-perform decoding with the second schedule, and, optionally, (iii) record to memory (e.g., hit list 708 of FIG. 7) data pertaining to the decoding performed with the second standard schedule. $L_{maxb}$-based layered-decoding systems can be used as simulated layered decoders for offline schedule testing (e.g., system 700 of FIG. 7) or as production layered decoders for online decoding (e.g., system 500 of FIG. 5).

In offline schedule testing according to certain embodiments of the present invention, schedule set 506 is a schedule population generated by a triad-based population-selection method, i.e., the schedules in schedule set 506 are schedules with an associated key-layer value.

Figure 9:
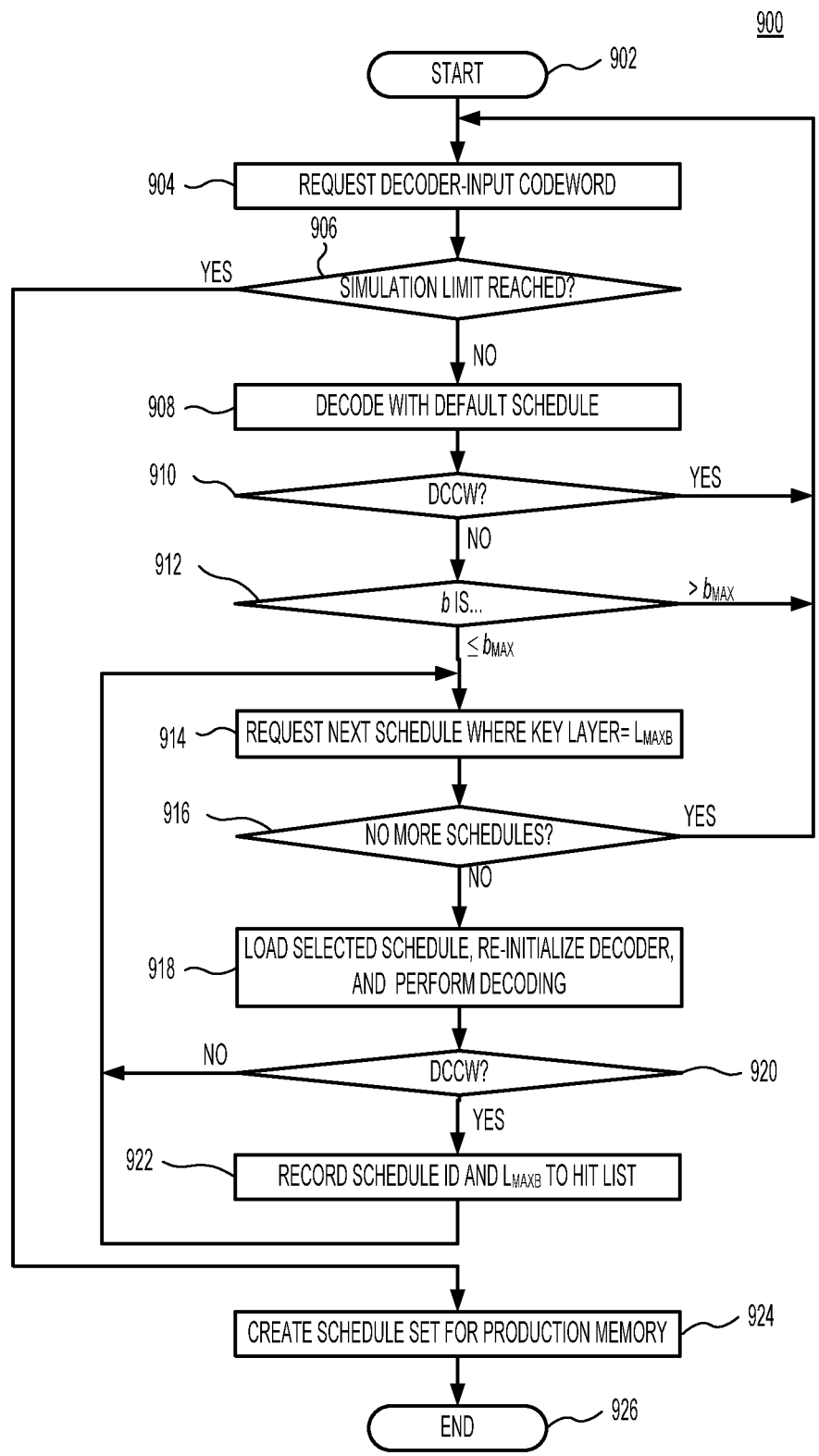
FIG. 9 is a flowchart of offline schedule-testing process 900 executed by simulated layered decoder 704 of system 700 of FIG. 7, wherein the schedules in schedule population 706 are schedules with an associated key-layer value, according to various embodiments of the present invention.

FIG. 9 is a flowchart of offline schedule-testing process 900 executed by simulated layered decoder 704 of system 700 of FIG. 7, wherein the schedules in schedule population 706 are schedules with an associated key-layer value, according to various embodiments of the present invention. Steps 902, 904, 906, 908, 910, 912, 916, 918, 920, and 926 are analogous to steps 802, 804, 806, 808, 810, 812, 816, 818, 820, and 826 of FIG. 8.

At step 914, process 900 requests the next schedule from the schedule population where the key layer of the next schedule is equal to layer $L_{maxb}$ for the current NCW.

Out of the n(n-1)(n-2) schedules in the schedule population, only 1/n of the schedules have a key layer equal to layer $L_{maxb}$ for the current NCW, and thus only 1/n of the schedules need to be tested against any particular NCW. In other words, only (n-1)(n-2) schedules need to be tested against a given NCW. For example, there are 720 schedules for a 10-layer decoder. A tenth of the schedules, i.e., 72, have a key layer of 0, another 72 schedules have a key layer of 1, and so forth. Since any given NCW contains only one $L_{maxb}$ value, only 72 schedules need to be tested against the NCW.

When combined, the triad-based population-selection method and the $L_{maxb}$-based layered-decoding system yield significant time improvements over the prior-art offline schedule-testing methods. Instead of testing all n! standard schedules against an NCW, certain embodiments of the present invention test only (n-1)(n-2) schedules against an NCW. Thus, for a 10-layer decoder with approximately 3.6 million standard schedules and 720 schedules, and assuming 10,000 NCWs to be tested, the time to perform offline schedule testing on a single computer drops from approximately 1,150 years to approximately 200 days.

Step 922 records both the schedule ID and the $L_{maxb}$ key-layer value to the hit list.

Step 924 takes hit list 708, i.e., the record of successful decodings, and generates a production schedule set that (i) is small enough to be stored within a production schedule memory and (ii) decodes the greatest number of NCWs. However, step 924 generates a production schedule set that comprises not only schedules themselves, but also the key layer(s) associated with the schedules.

In one embodiment of the present invention, step 924 creates a schedule set using the one-to-one method, where, for every triad, step 924 adds a single schedule and associates the schedule with a key-layer value. In other embodiments of the present invention, step 924 generates a schedule set using a more-memory-efficient one-to-many method, where step 924 identifies triads, not schedules, that successfully decode the maximum number of NCWs, and then selects the minimum number of schedules that contain the most-successful triads. A schedule in a schedule set generated by the one-to-many method might be associated with more than one key-layer value.

The offline schedule-testing embodiment discussed above processes a schedule population of schedules wherein each schedule is associated with one or more key-layer values. However, embodiments of the present invention are not so limited. It is possible to implement an offline schedule-testing system according to various embodiments of the present invention wherein one or more schedules in the schedule population have no associated key-layer value. In such an implementation (e.g., system 700 of FIG. 7), simulated layered decoder 704 would record to hit list 708 not just the key-layer value, but the entire key triad of the current schedule. Upon selecting a new schedule, the layered decoder would determine the key triad of the selected schedule, and search the hit list to see if the key triad had already been tested against the current NCW. If so, then the current schedule would be dropped and another schedule selected. If the key triad had not already been tested against the current NCW, then decoding would proceed with the selected schedule, and the results of the decoding recorded to the hit list.

$L_{maxb}$-based layered-decoding systems can also be used as production layered decoders, e.g., system 500 of FIG. 5. In certain embodiments of the present invention, schedule set 506 is a schedule set generated by process 900 of FIG. 9, i.e., the schedules in the schedule set already have one or more associated key-layer values.

Figure 10:
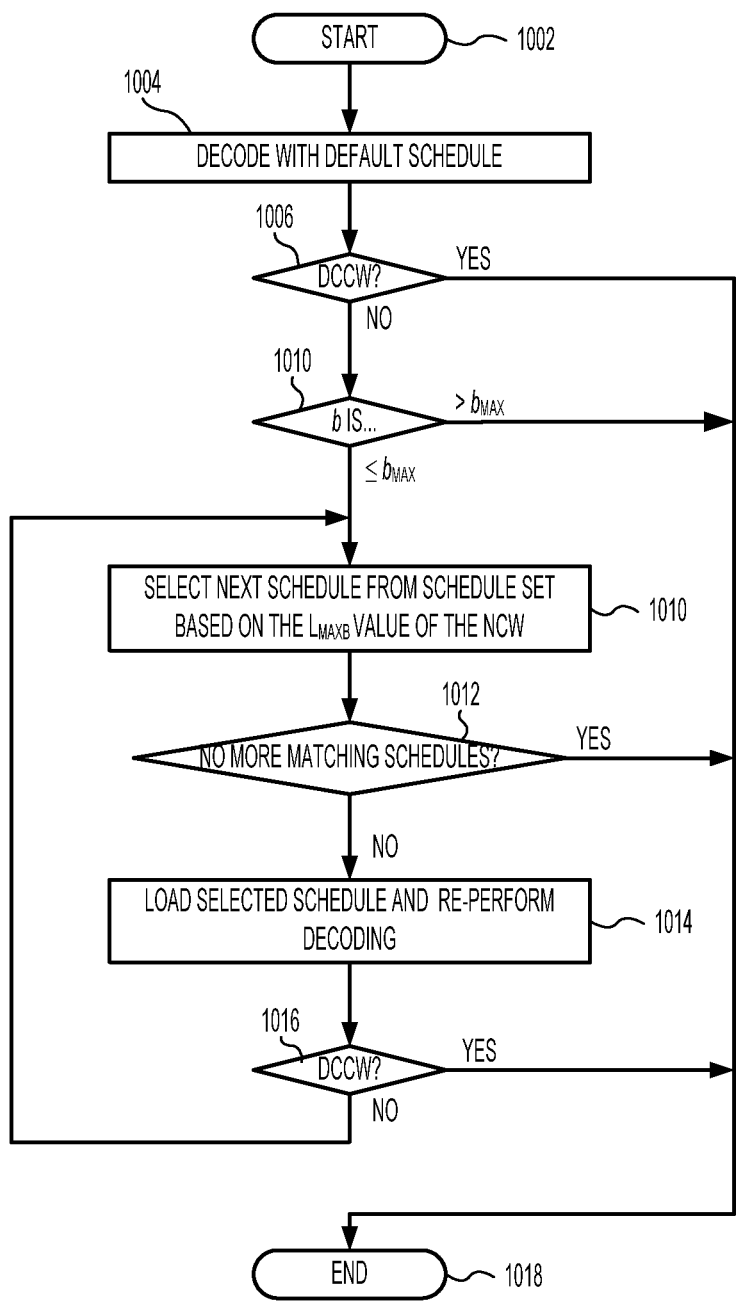
FIG. 10 is a flow diagram of a layered-decoding method 1000 executed by layered decoder 502 in production layered-decoding system 500 according to various embodiments of the present invention.

FIG. 10 is a flow diagram of a layered-decoding method 1000 executed by layered decoder 502 in production layered-decoding system 500 according to various embodiments of the present invention. Steps 1002, 1004, 1006, 1008, 1014, 1016, and 1018 are analogous to steps 602, 604, 606, 608, 614, 616, and 618 of FIG. 6. Step 1010 selects the next schedule from schedule set 506 where the key layer associated with the selected schedule is the same as the $L_{maxb}$ value of the original NCW from step 1004. If b=0, i.e., the NCW is an NCW-MC, then any schedule in schedule set 506 can be selected.

Step 1012 reports no more matching schedules if method 1000 has already tried every schedule where the key layer associated with the selected schedule is the same as the $L_{maxb}$ value of the current NCW. In contrast, step 612 of FIG. 6 would only report no more schedules if every schedule in schedule set 506 had been tried.

In one possible implementation of layered-decoding method 1000, decoding step 1014 uses the newly selected schedule to re-decode the original codeword input to default decoding step 1004. In another possible implementation, the re-performance of decoding in step 1014 uses the newly selected schedule to further decode the NCW from the previous decoding (i.e., either default decoding step 1004 or the previous execution of decoding step 1014). In this latter implementation, step 1010 selects the next schedule from schedule set 506 where the key layer associated with the selected schedule is the same as the $L_{maxb}$ value of the NCW from the previous decoding.

Non-Standard Schedules

The ability of a particular non-standard schedule to successfully decode a particular NCW is largely a function of the frequency of the layer that matches the $L_{maxb}$ value of the NCW, regardless of the number n of layers in the code or the sequence of the layers in the non-standard schedule. The greater the frequency of layer $L_{maxb}$ in a non-standard codeword, the greater the probability that the non-standard schedule will successfully decode the corresponding NCW. For example, if a 5-layer decoder fails with an NCW and an $L_{maxb}$ value of 2, then the non-standard schedule [0,2,1,2,3,2,4,2] will have a greater likelihood of successfully decoding the NCW than non-standard schedule [4,0,4,3,2,1,0,1] or standard schedule [0,1,2,3,4] because the frequency (i.e., four) of layer 2 in the first schedule is greater than the frequency (i.e., one) of layer 2 in the second and third schedules.

Thus, in the context of non-standard schedules, the term "key layer" comprises the layer with the greatest frequency. If there are two or more layers in a non-standard schedule that share the same maximum frequency value, then one or more of those layers may be selected as key layers for the schedule. As such, non-standard schedules can be stored in a schedule set and associated with one or more key-layer values.

Furthermore, a non-standard schedule can be tested using offline schedule-testing methods (e.g., method 800 of FIG. 8), in order to determine if the non-standard schedule is successful at breaking trapping sets for NCWs that possess an $L_{maxb}$ value other the value of the layer with the maximum frequency. For example, non-standard schedule [0,2,1,2,3,2,4,2] is assumed to have a key-layer value of 2 because layer 2 has the highest frequency. However, offline schedule testing might determine that non-standard schedule [0,2,1,2,3,2,4,2] is also effective at breaking trapping sets in NCWs where $L_{maxb}$=0. As such, non-standard schedule might be stored in a schedule set and associated with both key layer 2 and key layer 0.

Thus, certain embodiments of the present invention are offline schedule-testing systems (e.g., system 700 of FIG. 7) that associate a non-standard schedule with one or more key-layer values.

Other embodiments of the present invention are decoding systems (e.g., system 500 of FIG. 5) wherein the default schedule of layered decoder 502 is a non-standard schedule.

Yet other embodiments of the present invention are decoding systems (e.g., system 500 of FIG. 5) wherein (i) one or more of the default schedule and the schedules in schedule set 506 are non-standard schedules and (ii) layered decoder 502, upon converging on an NCW using a first schedule, selects a second schedule from schedule set 506, which second schedule is different from all other schedules previously used during this local-decoding iteration, and re-performs decoding using the second schedule.

Yet other embodiments of the present invention are decoding systems (e.g., system 500 of FIG. 5) wherein (i) schedule set 506 comprises one or more non-standard schedules, wherein each non-standard schedule is associated with one or more key-layer values and (ii) layered decoder 502 executes a process, e.g., process 1000 of FIG. 10, that selects non-standard schedules from schedule set 506 based on the $L_{maxb}$ value of an NCW.

Standard and Non-Standard Schedules Combined

Since both standard and non-standard schedules can be associated with one or more key-layer values, both types of schedules can be stored together in a schedule set according to various embodiments of the present inventions.

Thus, certain embodiments of the present invention are offline schedule-testing systems (e.g., system 700 of FIG. 7) that generate schedule sets that (i) comprise at least one standard schedule and at least one non-standard schedule and (ii) associate one or more schedules in the schedule set with one or more key-layer values.

Yet other embodiments of the present invention are decoding systems (e.g., system 500 of FIG. 5) wherein (i) schedule set 506 (A) comprises at least one standard schedule and at least one non-standard schedule and (B) associates each schedule with one or more key-layer values and (ii) layered decoder 502 executes a process, e.g., process 1000 of FIG. 10, that selects either or both standard and non-standard schedules from schedule set 506 based on the $L_{maxb}$ value of an NCW.

Although the present invention has been described in the context of hard disk drives and flash drives, the invention is not so limited. In general, the present invention can be implemented with any system involving communications encoded using an iterative decoder.

Yet further, although embodiments of the present invention have been described in the context of LDPC codes, the present invention is not so limited. Embodiments of the present invention could be implemented for any code which can be defined by a graph, e.g., tornado codes, structured IRA codes, since it is graph-defined codes which suffer from trapping sets.

Yet further, although embodiments of the present invention have been described in the context of layered codes wherein each layer comprises a set of check nodes that have no associated bit nodes in common, the present invention is not so limited. Embodiments of the present invention can be implemented for layered codes where a layer comprises a set of check nodes that have any number of associated bit nodes in common.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium or loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A decoder-implemented method for decoding a decoder input codeword, the method comprising:
   (a) selecting a decoding schedule for layered decoding, wherein:
      the layered decoding corresponds to a code having two or more layers; and
      at least one layer in the code appears more than once in the selected decoding schedule; and
   (b) performing the layered decoding on the decoder input codeword using the selected decoding schedule, wherein the selected decoding schedule cannot be completely decomposed into two or more iterations of another decoding schedule in which each layer of code appears.

2. A decoder-implemented method for decoding a decoder input codeword, the method comprising:
   (a) selecting a decoding schedule for layered decoding, wherein:
      the layered decoding corresponds to a code having two or more layers; and
      at least one layer in the code appears more than once in the selected decoding schedule; and
   (b) performing the layered decoding on the decoder input codeword using the selected decoding schedule, wherein the at least one layer that appears more than once in the selected decoding schedule corresponds to a layer in a different decoding schedule used in a previous layered decoding of the decoder input codeword, wherein the layer in the different decoding schedule used in the previous layered decoding has a greatest number of unsatisfied check nodes in a near codeword produced during the previous layered decoding.

3. A decoder-implemented method for decoding a decoder input codeword, the method comprising:
   (a) selecting a decoding schedule for layered decoding, wherein:
      the layered decoding corresponds to a code having two or more layers; and
      at least one layer in the code appears more than once in the selected decoding schedule; and
   (b) performing the layered decoding on the decoder input codeword using the selected decoding schedule, wherein step (a) comprises the step of selecting the subsequent decoding schedule from a decoding-schedule database comprising a plurality of different decoding schedules, wherein at least one of the plurality of different decoding schedules is associated with at least one the layer having the greatest number of unsatisfied check nodes in the near codeword produced during the previous layered decoding.

4. The invention of claim 3, wherein the layer having the greatest number of unsatisfied check nodes in a near codeword produced during the previous layered decoding is a layer that appears most often in the associated decoding schedule.

5. The invention of claim 3, wherein the schedules in the decoding-schedule database are sorted by the number of near codewords successfully decoded by each schedule during offline schedule-testing.

6. A decoder for decoding a decoder input codeword, the decoder comprising:
   (a) means for selecting a decoding schedule for layered decoding, wherein:
      the layered decoding corresponds to a code having two or more layers; and
      at least one layer in the code appears more than once in the selected decoding schedule; and
   (b) means for performing the layered decoding on the decoder input codeword using the selected decoding schedule, wherein the selected decoding schedule cannot be completely decomposed into two or more iterations of another decoding schedule in which each layer of code appears.

* * * * *

UNITED STATES PATENT AND TRADEMARK OFFICE
CERTIFICATE OF CORRECTION

| | | |
|---|---|---|
| PATENT NO. | : 8,555,129 B2 | Page 1 of 1 |
| APPLICATION NO. | : 12/510722 | |
| DATED | : October 8, 2013 | |
| INVENTOR(S) | : Kiran Gunnam | |

It is certified that error appears in the above-identified patent and that said Letters Patent is hereby corrected as shown below:

In the Claims:

In column 18, line 33, remove "at least one".

Signed and Sealed this
Fifteenth Day of July, 2014

Michelle K. Lee
*Deputy Director of the United States Patent and Trademark Office*